United States Patent [19]
Bean et al.

[11] Patent Number: 4,772,924
[45] Date of Patent: Sep. 20, 1988

[54] DEVICE HAVING STRAIN INDUCED REGION OF ALTERED BANDGAP

[76] Inventors: John C. Bean, 35 Radcliff Dr., New Providence, N.J. 07974; David V. Lang, 41 Woodcliff Dr., Madison, N.J. 07940; Thomas P. Pearsall, 156 Mountain Ave., Summit, N.J. 07901; Roosevelt People, 642 Sheridan Ave., Plainfield, N.J. 07060; Henryk Temkin, 130 Lorraine Dr., Berkeley Heights, N.J. 07922

[21] Appl. No.: 129,942

[22] Filed: Nov. 25, 1987

Related U.S. Application Data

[63] Continuation of Ser. No. 799,154, Nov. 18, 1985, abandoned.

[51] Int. Cl.[4] .................................... H01L 27/12
[52] U.S. Cl. ................................ 357/4; 357/30; 357/13; 357/16
[58] Field of Search ............ 357/4 SL, 4, 30 A, 30 N, 357/13, 16

[56] References Cited

U.S. PATENT DOCUMENTS

| | | | |
|---|---|---|---|
| 3,626,257 | 12/1971 | Esozhi | 357/4 SL |
| 4,212,019 | 7/1980 | Wataze | 357/16 |
| 4,616,241 | 10/1986 | Biefeld | 357/4 SL |

Primary Examiner—Martin H. Edlow
Attorney, Agent, or Firm—Richard D. Laumann; Peter A. Businger

[57] ABSTRACT

A strained layer superlattice comprising $Ge_xSi_{1-x}$ layers interleaved with Si layers is an excellent photodetector at infrared wavelengths due to the large shift in bandgap caused by the strain in the superlattice.

20 Claims, 2 Drawing Sheets

DEVICE HAVING STRAIN INDUCED REGION OF ALTERED BANDGAP

This application is a continuation of application Ser. No. 799,154, filed Nov. 18, 1985 now abandoned.

TECHNICAL FIELD

This invention relates generally to the field of semiconductor devices such as photodetectors having a strain induced region of altered bandgap and particularly to such photodetectors using a silicon-germanium region.

BACKGROUND OF THE INVENTION

There is much interest at the present time in fabricating photodetectors useful in detecting radiation having wavelengths longer than 1.0 $\mu$m. Such photodetectors would be useful in, for example, optical communications systems operating in the wavelength region between 1.3 and 1.6 $\mu$m which is the region that includes the wavelengths of both minimum loss and minimum dispersion for silica based optical fibers.

Avalanche photodetectors are desirable for many purposes because of the gain they provide within the detector. A variety of semiconductor materials has been used in such photodetectors which should have desirable characteristics such as low noise. Silicon is an almost ideal semiconductor with respect to its noise performance because of the large ratio of ionization coefficients, but it cannot be used for wavelengths longer than 1.0 $\mu$m because its bandgap is too large. The large ratio of ionization coefficients leads to a low excess noise factor. Germanium has a bandgap which would permit it to absorb radiation at wavelengths as long as 1.6 $\mu$m, but it is not an ideal avalanche photodetector material because its ratio of the ionization coefficients is approximately one and a large excess noise factor results. Perhaps even more significantly, it has a relatively small bandgap and there is a large dark current at room temperature.

Of course, one might think that the problems that are apparently inherent in both germanium and silicon might be circumvented by absorbing the radiation in a germanium region and letting the avalanche process initiated by the photogenerated carriers occur in a silicon region. Such an approach using separate absorption and multiplication regions has been proposed. See, for example, U.S. Pat. No. 4,212,019 issued on July 8, 1982, Wataze et al (Wataze) and especially his Examples 1 and 3. These Examples describe a silicon avalanche multiplication region and Ge and Ge$_x$Si$_{1-x}$, respectively, absorption regions. This approach is, however, not free of difficulties. For example, as is well known, there is a relatively large lattice mismatch between silicon and germanium. Therefore, simply growing germanium on a silicon substrate or epitaxial layers will yield high quality, i.e., defect free, germanium layers only if the germanium layers are relatively thin. This is practically impossible as the germanium layers should be less than 10 Angstroms thick. However, this is undesirable for avalanche photodetectors because germanium-silicon alloys and elemental germanium, being indirect bandgap materials, have relatively low absorption coefficients in the wavelength region of interest for optical communications. Thus, a photodetector having high quantum efficiency, i.e., high absorption, would require a relatively long optical path length which is difficult, if not impossible, to achieve in conventional photodetector designs using Ge and Si. In such designs the photogenerated carriers move either substantially parallel or antiparallel to the direction of light propagation.

Growing the alloy layer with only a small amount of Ge may alleviate problems caused by the mismatch but will not permit absorption at long wavelengths. This problem increases as the wavelength of the incident radiation becomes longer because the bandgap decreases as the germanium fraction increases. It is especially severe when optical communications applications near 1.55 $\mu$m are contemplated. To obtain a bandgap low enough to enable the germanium silicon alloy to absorb at 1.55 $\mu$m, the germanium fraction in the alloy layer must be very large. However, it is difficult to grow these alloy layers with both an appreciable thickness and a large germanium fraction without generating high dislocation densities. Thus, absorption will be undesirably low at 1.55 $\mu$m due to the thinness of the layer. Essentially, identical considerations are applicable at 1.3 $\mu$m.

Although it has been known for a long time that several effects, including pressure, can alter the bandgap, it has generally been believed by those skilled in the art that the effects arising from any attainable change in the pressure would be too small to alter the bandgap by a significant amount with respect to parameters considered for device design. For example, it was believed that it would be too small to alter the bandgap of a germanium silicon alloy sufficiently to make such alloys useful for use in photodetectors at 1.55 $\mu$m. Of course, it was also generally believed that the effect of strain induced bandgap variations would be too small to lead to useful effects in other types of devices. For example, light emitting devices might emit at wavelengths other than expected from the properties of the bulk materials but the expected shift would be small.

SUMMARY OF THE INVENTION

We have found that a strained layer region can provide a desirable reduction in bandgap for many device applications. In one particular embodiment, the device comprises alternating layers of Ge$_x$Si$_{1-x}$ and Ge$_y$Si$_{1-y}$, x greater than y and 0.0 and less than or equal to 1.0, and at least one cladding layer. A device with two surrounding cladding layers provides, e.g., a photodetector, having useful characteristics. The cladding layers typically comprise silicon.

The superlattice and two surrounding silicon layers provide a photodetector having useful characteristics. In particular, the effect of strain within the strained layer region is sufficiently large that the bandgap of the strained layer region is decreased significantly and absorption is much greater than expected for a given value of x at wavelengths of interest, e.g., 1.3 $\mu$m and greater, for optical communications. In one preferred embodiment, the photodetector is a waveguide photodetector in which the light is incident parallel to the layers of the strained layer region, and the Ge$_x$Si$_{1-x}$ superlattice acts as the absorbing region. In yet another embodiment, there is an additional silicon layer having intrinsic conductivity between the strained layer absorption region and a cladding layer which functions as an avalanche region. Thus, the avalanche photodetector is expected to have noise characteristics approximating those of a silicon avalanche photodetector although absorption occurs in a Ge$_x$Si$_{1-x}$ layer.

The strianed layer region is typically grown on a silicon substrate with at least one epitaxial layer between the strained layer region and the substrate.

For reasons of clarity, the elements of the devices are not drawn to scale.

DETAILED DESCRIPTION

Figure 1:
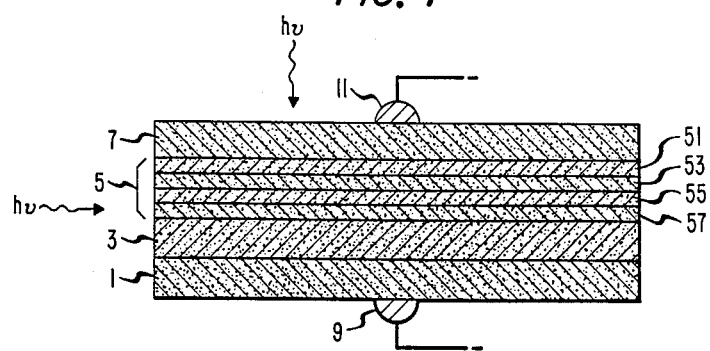
FIG. 1 is a view of a photodetector according to this invention.

An exemplary embodiment of a strained layer device according to this invention is depicted in FIG. 1. The particular device depicted is a p-i-n photodiode, which comprises substrate 1, a first silicon cladding layer having a first conductivity type 3, a $Ge_xSi_{1-x}$/Si superlattice region 5 and a second silicon cladding layer 7 having a second conductivity type. The second layer and the substrate are electrically contacted by metallizations 9 and 11, respectively. The substrate also has the first conductivity type. There may additionally be a buffer layer between the substrate and the first silicon layer. The substrate and buffer layer have the same composition and conductivity type. The superlattice region comprises alternating, that is, interleaved, layers of Si and $Ge_xSi_{1-x}$ indicated as 51, 53, 55 and 57. More layers will typically be present but are not shown for reasons of clarity. The region has a total thickness $h_{SL}$. Each period has a thickness T and the $Ge_xSi_{1-x}$ layers have a thickness h. The layers should be grown in the region of commensurate epitaxy so that the mismatch strain will not be relived by dislocations.

Conventional growth techniques may be used to fabricate the device including the superlattice region. Molecular beam epitaxy is conveniently used to grow the superlattice region as well as the silicon layers. Details of the growth technique including selection of substrate temperature, layer thickness, etc., are described in, for example, U.S. Pat. No. 4,529,455 issued on July 16, 1985 to John C. Bean, Leonard C. Feldman and Anthony T. Fiory. The other techniques used during fabrication, including, but not limited to, for example, plasma etching oxidation, oxide deposition, ion implantation and metallization are typically standard very large scale integration processing techniques. As such, they are well known to those skilled in the art and need not be described in further detail.

The strained layer region may comprise alternating layers of different compositons and lattice constants. For example, it may comprise interleaved layers of $Ge_xSi_{1-x}$ and $Ge_ySi_{1-y}$ with x greater than y and less than or equal to 1.0. The values of x and y need not be constant within the strained layer region. Variations of x and y within the strained layer region may lead to increased waveguiding. The term superlattice is used to mean the strained layer region of interleaved $Ge_xSi_{1-x}$ and $Ge_ySi_{1-y}$ layers.

Figure 2:
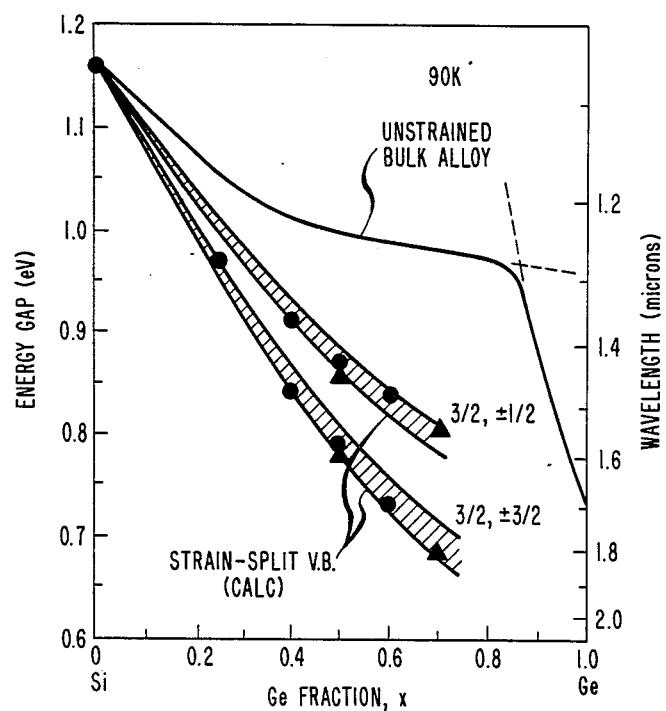
FIG. 2 is the energy band diagram for germanium silicon alloys in a $Ge_xSi_{1-x}$/Si superlattice plotted vertically versus their germanium fraction plotted horizontally.

Due to the shift in bandgap caused by strain, the choice of x and y, which determines the bandgap, will be different from that expected from the bandgaps of the bulk materials. This is illustrated by reference to FIG. 2 which plots the Ge fraction horizontally versus the bandgap in eV, vertically for both a strained and unstrained $Ge_xSi_{1-x}$/Si superlattice. As can be seen, if the materials were not strained, one would select x=0.8 for a photodetector absorbing at 1.35 μm. However, because of the shift in bandgap induced by strain, a value of only approximately 0.3 gives the same effect. However, because the absorption coefficient increases rapidly above the bandgap, it is advantageous for detector efficiency to operate as far above as possible. For x=0.3, only marginal sensitivity will be obtained at 1.3 μm. Similar considerations apply for other materials and wavelengths.

The substrate had a (100) orientation. Similar effects are expected for a (110) orientation while a (111) substrate should yield at most only a small effect. The orientation of the strain axis relative to the orientation of the conduction band minima is critical.

The superlattice, i.e., strained layer region, is strained because of the lattice mismatch between the Si and the alloy layers. The thickness of the absorbing superlattice region may be extended in the vertical direction without the introduction of additional defects, e.g., misfit dislocations due to lattice mixmatch arising during the growth process. Light may be incident on the photodetector vertically or it may be incident horizontally. In the latter case, the strained layer superlattice functions as a waveguide because the $Ge_xSi_{1-x}$ alloy layers have an index of refraction greater than that of Si layers. The latter embodiment is preferred as the absorbing region is larger than it is for vertical illumination. Of course, light may be coupled into the waveguide by means of a grating or a prism.

Figure 3:
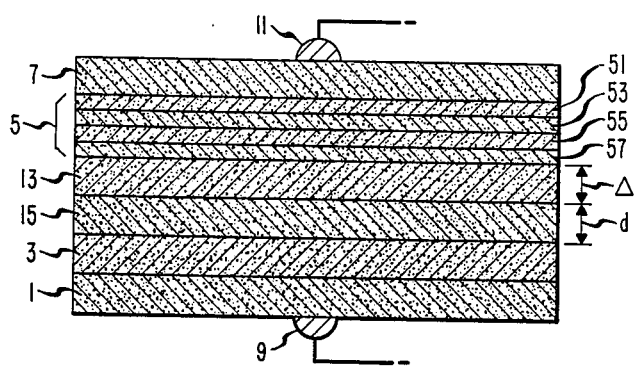
FIG. 3 is a schematic representation of an avalanche photodetector according to this invention.

Another embodiment of an avalanche photodetector according to this invention is depicted in FIG. 3. Numerals identical to thse used in FIG. 1 represent identical elements. The device further comprises a third silicon layer having the first type conductivity and a thickness Δ and a fourth silicon layer having intrinsic conductivity and a thickness d. The third layer is relatively thin, generally less than $10^{-4}$cm, and is depleted during operation by the applied reverse bias. The device should have a high-low electric field configuration, i.e., the absorption and multiplication regions have a low and high, respectively, electric field. Calculation of appropriate doping levels will be easily done by those skilled in the art. The third layer is adjacent the superlattice region.

Figure 4:
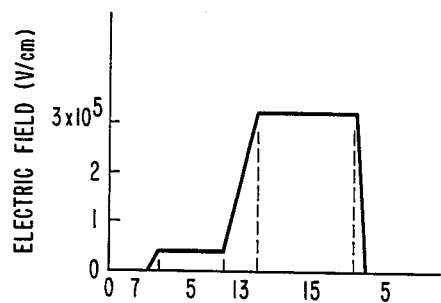
FIG. 4 is the electric field diagram for the avalanche photodetector depicted in FIG. 3.

Several factors should be considered in the device design to reduce the excess noise resulting from the avalanche multiplication process. Electrons should initiate the avalanche process for the embodiment depicted. The electric field in the avalanche region should be near threshold and the region should be much thicker than the inverse of the ionization coefficient. Additionally, the electric field in the superlattice region should not exceed the ionization threshold for germanium. The resulting electric field is depicted in FIG. 4. The field is plotted vertically and the device regions are shown horizontally. In another embodiment, the p-n junction is above, rather than below, the strained layer region. This embodiment may have better waveguiding properties.

Carriers are absorbed in the superlattice region and the avalanche process occurs in the intrinsic conductivity silicon layer. A multiplication factor as large as 50 was obtained for a breakdown voltage of 85 volts.

For absorption in the 1.3 [2 m region, the alloy layers in the superlattice region should have a Ge fraction which should be within the range of approximately 0.4 to approximately 0.6. It will be readily appreciated by those skilled in the art that as x increases, quantum effects may also result in shifts in the energy levels. However, the thickness of such a layer is limited to less than approximately 100 Angstroms. For higher values of x and smaller layer thicknesses, the quantum well shift will be to shorter wavelengths. It does not therefore pay to increase x above 0.6 since quantum effects will dominate and 1.3 $\mu$m responsivity will decrease. Consequently, to ensure that there is sufficiently large absorption of the incident light, the incident light is conveniently launched into the buried waveguide formed by the $Ge_xSi_{1-x}$/Si superlattice. This is possible because, as previously explained, the superlattice has a larger index of refraction in the alloy layers than in the Si layers.

Figure 5:
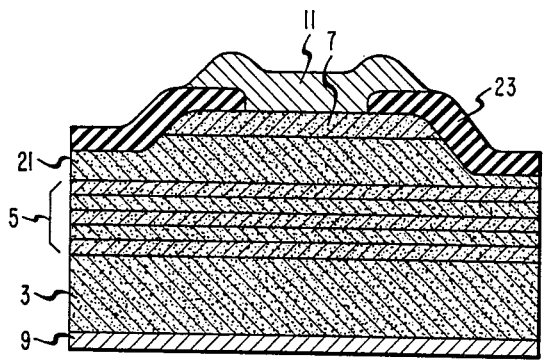
FIG. 5 is a schematic representation of yet another avalanche photodetector according to this inventin.

Yet another embodiment is depicted in FIG. 5. This embodiment further comprises a third silicon layer 21 having the first conductivity type adjacent the superlattice region 5. There is also a passivation layer 23. The passivation layer may comprise, for example, $SiO_2$ and the metallization, i.e., contacts, may comprise aluminum. It will be readily appreciated that the p-n junction may be formed by doping the epitaxial layers during growth or it may be formed after growth by using, for example, ion implantation.

For the exemplary embodiment depicted, there were 20 wells of $Ge_{0.6}Si_{0.4}$, each 40 Angstroms thick, which were separated by 200 Angstrom thick Si barrier layers in the superlattice region. When the Ge fraction increased to 0.8, the well thickness had to be reduced to less than 20 Angstroms. A waveguide thickness of approximately 6500 $\mu$m was obtained. The undoped superlattice region was capped with a 1 $\mu$m thick p-type Si layer doped with boron at density of approximately $5 \times 10^{16}$ cm$^{-3}$ and capped by a thin p+ contact layer doped to a density of approximately $10^{17}$ cm$^{-3}$. The electrical characteristics of the p-i-n photodiode were excellent. The reverse breakdown voltage varied form 30 to 38 volts regardless of the Ge fraction in the superlattice. The range for breakdown voltages was consistent with the silicon doping level and suggestive of the p-n junction within the Si layer. It was noted that the leakage current increased slowly with the Ge fraction.

It is noted that the device absorbs at wavelengths as long as approximately 1.55 $\mu$m. This is a surprising result in view of the expected bandgaps of the $Ge_xSi_{1-x}$ alloys. It is attributed to the fact that the amount of strain in the superlattice is large and greatly reduces the bandgap. Accordingly, the values of x selected for the superlattice are reduced from the values expected to obtain absorption at a given wavelength.

Still other embodiments are contemplated. For example, the strained layer superlattice may be topped by an intrinsic conductivity type Ge layer and a heavily doped Ge layer. These layers together with the superlattice form an absorption region. Again, the carriers avalanche in the intrinsic conductivity Si region. Additionally, it will be readily appreciated that devices other than photodetectors may be usefully fabricated. For example, it is possible that the devices may be used as light emitters with the two cladding layers having opposite conductivity types. The strain will shift the wavelength of the emitted radiation from that expected from the bulk characteristics. More generally, devices, such as MODFETs, in which the transport properties are modified by strain are contemplated. Also contemplated are heterojunction devices with different bandgaps of which at least one is modified by strain. It will now be readily appreciated by those skilled in the art that the values of x will be reduced in nonoptical heterojunction devices, such as modulation doped transistors and heterojunction bipolar transistors. Furthermore, use as a photodetector at wavelengths between 1.3 $\mu$m and the silicon band edge is also contemplated.

What is claimed is:

1. A device comprising a substrate and disposed thereon a first cladding layer, an interleaved region of alternating first and second compositions comprising $Ge_xSi_{1-x}$ and $Ge_ySi_{1-y}$, respectively, x greater than y and less than or equal to 1.0, having different lattice constants and a lattice mismatch, said mismatch being accommodated by strain thereby changing the bandgap from that of the bulk compositions and at least one of said x and y being selected to yield the strain induced bandgap.

2. A device as recited in claim 1 further comprising a second cladding layer on the side of said interleaved region opposite to that of said first cladding layer.

3. A device as recited in claim 2 in which said first and second clading layers have opposite conductivity types.

4. A device as recited in claim 3 in which x and y are essentially constant in said strained layer region.

5. A device as recited in claim 4 in which said first and second cladding layers comprise silicon.

6. A device as recited in claim 5 further comprising a third layer of silicon having intrinsic conductivity and being between said second layer and said interleaved region.

7. A device as recited in claim 6 further comprising a fourth layer of silicon having a first conductivity type and being between said third layer and said interleaved region.

8. A device as recited in claim 7 in which said first conductivity type is n-type.

9. A device as recited in claim 5 in which x is between approximately 0.4 and approximately 0.6.

10. A device as recited in cliam 1 in which said substrate comprising Si having an orientation selected from the group consisting of (100) and (110).

11. A device comprising a substrate and disposed thereon a first layer comprising $Ge_xSi_{1-x}$, x greater than 0.0 and less thanor equal to 1.0, having a different lattice constant than said substrate and a lattice mismatch, said mixmatch being accommodated by strain thereby changing the bandgap from that of the bulk composition and said x being selected to yield the strain induced bandgap.

12. A device as recited in claim 11 in which said substrate comprises Si.

13. A device as recited in claim 12 further comprising a second layer comprising $Ge_ySi_{1-y}$, y greater than or equal to 0.0 and less than 1.0, x not equal to y, sid second layer being disposed on said first layer, said first and second layers comprising a pair of layers.

14. A device as recited in claim 13 in which said first alyer and said second layers have opposite conductivity types.

15. A device as recited in claim 14 further comprising first and second electrical contacts to said substrate and second layer, respectively.

16. A device as recited in claim 15 in which said substrate and said second layer have the same conductivity types.

17. A device as recited in claim 16 in which y is less than x.

18. A device as recited in claim 17 further comprising a third electrical contact to said second layer.

19. A device as recited in claim 13 further comprising first and second electrical contacts to said second layer.

20. A device as recited in claim 13 comprising a plurality of said pairs.

* * * * *

UNITED STATES PATENT AND TRADEMARK OFFICE
CERTIFICATE OF CORRECTION

PATENT NO. : 4,772,924

DATED : September 20, 1988

INVENTOR(S) : John C. Bean et al.

It is certified that error appears in the above-identified patent and that said Letters Patent is hereby corrected as shown below:

Title page: Assignee should read --Bell Telephone Laboratories, Incorporated, Murray Hill, N.J. and American Telephone and Telegraph, Incorporated, New York, N.Y.--.

Column 3, line 17, "inventin" should read --invention--.
Column 4, line 28, "mixmatch" should read --mismatch--.
Column 4, line 40, "thse" should read --those--.
Column 5, line 5, "[2m" should read --µm--.
Column 5, line 29, "metallization" should read --metallizations--
Column 5, line 46, "form" should read --from--.
Column 6, line 30, "clading" should read --cladding--.
Column 6, line 53, "thanor" should read --than or--.
Column 6, line 55, "mixmatch" should read --mismatch--.
Column 6, line 63, "sid" should read --said--.
Column 6, line 67, "alyer" should read --layer--.

Signed and Sealed this

Twentieth Day of June, 1989

Attest:

DONALD J. QUIGG

*Attesting Officer*          *Commissioner of Patents and Trademarks*